(12) United States Patent
Hara et al.

(10) Patent No.: US 6,288,965 B1
(45) Date of Patent: Sep. 11, 2001

(54) REFERENCE VOLTAGE GENERATING CIRCUIT, SEMICONDUCTOR MEMORY DEVICE AND BURN-IN METHOD THEREFOR

(75) Inventors: Motoko Hara; Seiji Sawada, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/592,787

(22) Filed: Jun. 13, 2000

(30) Foreign Application Priority Data

Jan. 4, 2000 (JP) .................................................. 12-000079

(51) Int. Cl.$^7$ ....................................................... G11C 7/00
(52) U.S. Cl. .................. 365/225.7; 365/201; 365/189.09
(58) Field of Search ................................. 365/225.7, 201, 365/189.09

(56) References Cited

U.S. PATENT DOCUMENTS

| | | | |
|---|---|---|---|
| 5,426,616 | * 6/1995 | Kajigaya et al. | 365/225.7 |
| 5,448,199 | * 9/1995 | Park | 327/546 |
| 5,530,674 | * 6/1996 | McClure et al. | 365/201 |
| 6,128,241 | * 10/2000 | Choi | 365/225.7 |
| 6,160,745 | * 12/2000 | Hashimoto | 365/200 |

FOREIGN PATENT DOCUMENTS 4290458   10/1992   (JP) .

* cited by examiner

*Primary Examiner*—Huan Hoang

(57) ABSTRACT

A reference voltage generating circuit having a fuse for controlling resistance includes a burn-in circuit for supplying burn-in voltage between opposite terminals of the fuse when a control signal is inputted to the burn-in circuit.

20 Claims, 2 Drawing Sheets

REFERENCE VOLTAGE GENERATING CIRCUIT, SEMICONDUCTOR MEMORY DEVICE AND BURN-IN METHOD THEREFOR

BACKGROUND OF THE INVENTION

1. Field of the Invention

The present invention relates to a semiconductor memory device having a burn-in circuit. More particularly, the present invention relates to a semiconductor memory device having a burn-in circuit for supplying a burn-in voltage to at least one of circuit elements that has been incorporated in the memory device together with the other circuit elements, but is selectively extincted according to the particular circuit design of the semiconductor device.

2. Description of the Related Art

A conventional reference voltage generating circuit (Vref circuit) comprises a plurality of resistance adjusting fuses for controlling resistance of the circuit. The resistance is controlled by cutting one or some of these fuses, so that a reference voltage generating circuit capable of applying a certain voltage can be obtained.

FIG. 3A shows an enlarged plan view of a fuse, in which wires 1 forming a circuit together with the fuse 2 are connected with opposite ends of the fuse 2. When as shown in FIG. 3B, a laser beam 3 is applied to the fuse 2, the fuse 2 melts to break with the circuit line consequently opened. In the field of manufacture of semiconductor devices, such a fuse is employed in a plural number in each of those semiconductor devices being manufactured so that at the time the semiconductor device is incorporated in a circuit that requires for the semiconductor device to exhibit a particular line resistance, one or some of the fuses in the semiconductor device may be extincted by radiation of a laser beam to allow the semiconductor device to exhibit such particular line resistance.

In a highly integrated semiconductor memory device, width of the fuse 2 used therein is so small that the laser beam 3 will not impinge exactly upon an intended site of the fuse 2 and may often impinge at a wrong site of the fuse 2 as shown in FIG. 4A, 4B or 4C. Specifically FIG. 4A illustrates the case in which the fuse 2 is not cut because of the laser beam impinging out of the fuser 2. FIG. 4B illustrates the case in which the fuse 3 is partially cut as a result of the laser beam impinging upon the fuse 2 at a location offset from the intended site. FIG. 4C illustrates the case in which the wire 1 is cut as a result of the laser beam impinging upon such wire 1.

If the line resistance exhibited by the reference voltage generating circuit employed in the semiconductor memory device is found falling within a permissible tolerance after one or some of the fuses 2 have been cut, the reference voltage generating circuit may be considered acceptable and free from a defect. That is, even if the reference voltage generating circuit comprises the insufficiently cut fuses 2 such as shown in FIGS. 4B and 4C, the resultant reference voltage generating circuit is generally treated as an acceptable product free from a defect, provided that the total resistance of the circuit is within the design tolerance.

However, where a partially cut fuse 2 such as shown in FIG. 4B remains employed in the reference voltage generating circuit, the cutting may progress and the fuse 2 may eventually break down during the use thereof on the active generating circuit. Once this occurs, the total resistance of all of those fuses used in the reference voltage generating circuit increases with passage of time of use thereof and finally the generating circuit will come to fail to supply a requisite reference voltage.

Also, in the conventional semiconductor memory device, it has been a problem that resistance of wire, for example, a bit line, shifts with passage of time of use thereof.

SUMMARY OF THE INVENTION

Accordingly, an object of the present invention is to provide a semiconductor memory device wherein means is provided for avoiding any possible change of one or more fused used in a reference voltage generating circuit with passage of time and/or any possible change in line resistance with passage of time.

As a result of intensive researches conducted by the inventors of the present invention, the inventors have found that, by supplying a burn-in voltage across the fuses in the reference voltage generating circuit or across the wires to which a voltage is not supplied in a normal operation mode, a semiconductor device whose characteristic tends to change with passage of time can be eliminated.

That is, the present invention provides a reference voltage generating circuit having a fuse for controlling resistance, comprising a burn-in circuit for supplying a burn-in voltage between opposite terminals of the fuse when a control signal is inputted to the burn-in circuit.

In this reference voltage supplying circuit including the burn-in circuit, the burn-in voltage can be supplied across the fuse to which no voltage is supplied in a normal operating mode. This results in burn-in of the fuse employed in the reference voltage supplying circuit, and therefore, the semiconductor memory device with high reliability can be obtained.

It should be noted that the burn-in method in which the burn-in voltage is supplied across a fuse element used in a semiconductor device is disclosed in Japanese Laid-open Patent Publication No. 04-290458. According to this publication, the burn-in process is performed by supplying a higher voltage across the fuse element than the voltage which is supplied during the normal operation mode. The present invention, however, differs therefrom in that the burn-in voltage is supplied across the fuse to which no voltage is supplied during the normal operation mode.

Also, the present invention provides a reference voltage generating circuit, wherein the burn-in circuit includes a switching circuit for electrically disconnecting the opposite terminals of the fuse from the reference voltage generating circuit when the control signal is inputted to the burn-in circuit, and a voltage supply circuit for supplying a voltage between the opposite terminals of the fuse when the control signal is inputted to the burn-in circuit.

With the burn-in circuit, the burn-in of the fuse for controlling the resistance can be performed.

The switching circuit and the voltage supply circuit are preferably controlled by the same control signal. It is because that a highly integrated circuit can be obtained.

Also, the present invention provides a semiconductor memory device including the above-described reference voltage generating circuit.

Also, the present invention provides semiconductor memory device having a plurality of wires which are held at substantially the same electric potential during the operation mode. This memory device also includes a burn-in circuit for supplying a burn-in voltage between at least two wires when a control signal is inputted to the burn-in circuit.

In the semiconductor memory device including the burn-in circuit, the burn-in voltage can be supplied across the wire to which no voltage is supplied during the normal operating mode. This results in burn-in of the wire and, therefore, the semiconductor memory device with high reliability can be obtained.

Also, the present invention provides a semiconductor memory device, wherein the burn-in circuit includes a switching circuit for electrically disconnecting the wires from the semiconductor memory device when the control signal is inputted, and a voltage supply circuit for supplying a voltage between the wires when the control signal is inputted.

Both of the switching circuit and the voltage supply circuit are preferably controlled by the same control signal. It is because that highly integrated circuit can be obtained.

The present invention furthermore provides a burn-in method for reference voltage generating circuit having a fuse for controlling resistance. This method comprises a burn-in step of electrically disconnecting the opposite terminals of a fuse from a reference voltage generating circuit, and supplying voltage between the terminals of the fuse, and a selecting step of measuring the resistance of the fuse in order to select the reference voltage generating circuit having a certain resistance after the burn-in step.

Also, the present invention provides a burn-in method for the semiconductor memory device of a kind having a reference voltage generating circuit, which method comprises the above-described steps.

Also, the present invention provides a burn-in method for the semiconductor memory device of a kind having a plurality of wires, which method comprises a burn-in step of electrically disconnecting the wires from the semiconductor memory device, and supplying voltage between the wires, and a selecting step of measuring the resistance of the wire in order to s elect the semiconductor memory device having a certain resistance after the burn-in step.

As can be seen from above description, in the semiconductor memory device according to the present invention, the reference voltage generating circuit comprises the burn-in circuit. Accordingly, the burn-in of the fuse of the reference voltage generating circuit can be performed, and the semiconductor memory device with high reliability can be obtained.

BRIEF DESCRIPTION OF THE DRAWINGS

The present invention will become readily understood from the following description of preferred embodiments thereof made with reference to the accompanying drawings, in which like parts are designated by like reference numeral and in which.

DETAILED DESCRIPTION OF THE PREFERRED EMBODIMENTS

I. Embodiment 1

Figure 1:
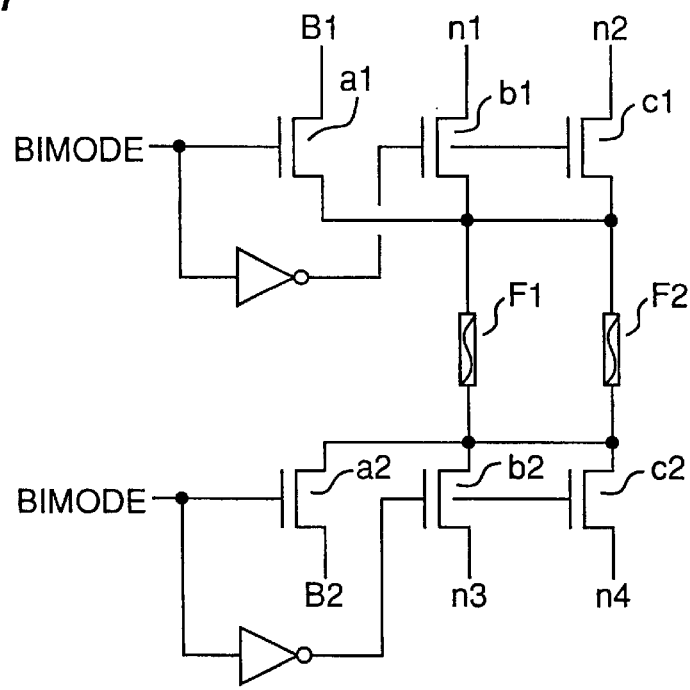
FIG. 1 shows a circuit diagram of a reference voltage generating circuit according to a first embodiment of the present invention.

A circuit diagram of a reference voltage generating circuit (Vref circuit) according to the first embodiment of the present invention is shown in FIG. 1. In the conventional reference voltage generating circuit, a voltage is not supplied between opposite terminals of each of fuse F1 and F2, in which the fuse F1 is connected between lines n1 and n3, and the fuse F2 is connected between lines n2 and n4.

On the other hand, in the reference voltage generating circuit of this embodiment, transistors b1 and b2 are connected between lines n1 and n3, and transistors c1 and c2 are connected between lines n2 and n4.

Also, a source terminal of a transistor a1 is connected to the junction between the fuse F1 and the transistor b1 and also to the junction between the fuse F2 and the transistor c1. A voltage of B1 is supplied to a drain terminal of the transistor a1.

On the other hand, a source terminal of a transistor a2 is connected to the junction between the fuse F1 and the transistor b2 and also to the junction between the fuse F2 and the transistor c2. A voltage of B2 is supplied to a drain terminal of the transistor a2. The voltage of B1 is not equal to that of B2.

In the normal operation mode, the transistors a1 and a2 are in an L level (off state), and transistors b1, b2, c1 and c2 are in an H level (on state). In this case, voltage is not applied across each of the fuses F1 and F2.

On the other hand, in a burn-in mode, a signal BIMODE (Burn In MODE) is inputted to the gate terminals of the transistors a1 and a2, so that the transistors a1 and a2 turn into an H level, and the transistors b1, b2, c1 and c2 turn into an L level. Thereby, the voltage at one terminal of each of the fuses F1 and F2 becomes B1, and that at the opposite terminal of each of the fuses F1 and F2 becomes B2. This results in that a voltage equal to the difference between the voltages B1 and B2 is supplied across each of the fuses F1 and F2, and, the fuses F1 and F2 are burned in. For example, the voltages B1 and B2 may be 5 volts and 0 volt, respectively.

It should be noted that the signal BIMODE applied to the transistors a1 and a2 is preferably inputted through a single common input terminal.

Figure 4A:
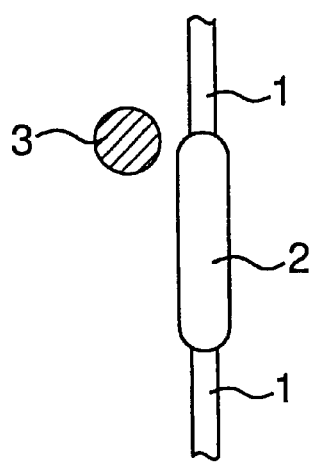
FIGS. 4A to 4C are schematic diagrams showing different manners of the fuse being cut.
Figure 4B:
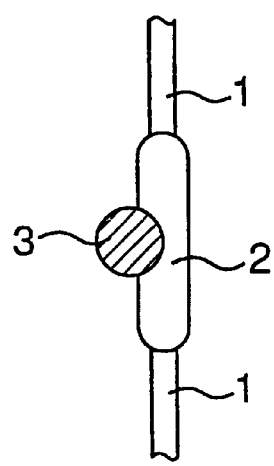
Figure 4C:
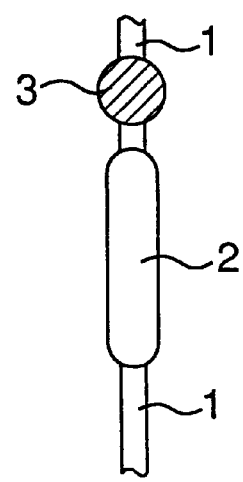

During the burn-in process, the fuses F1 and F2 are subjected to an accelerating test. Particularly, when such a fuse that is partially cut as shown in FIG. 4B is subjected to the accelerating test, the fuse is perfectly cut . Therefore, the resistance of the reference voltage generating circuit having such fuse, if found deviating from a predetermined permissible value, can be rejected as a defective circuit.

On the other hand, if the partially cut fuse is completely cut as a result of the burn-in process, the reference voltage generating circuit utilizing such fuse can be deemed acceptable provided that the resistance of such reference voltage generating circuit falls within the predetermined permissible value.

Also, where the accelerating test proves that the partial cutting does not proceed in the fuse shown in FIG. 4B during the burn-in process, the resistance of the fuse is deemed not to change with passage of time during the normal operating mode in which no voltage is supplied across the fuse. In this case, the reference voltage generating circuit is used as an acceptable product.

As described above, because of the reference voltage generating circuit of the semiconductor memory device provided with the burn-in circuit, the reference voltage generating circuit whose generating voltage changes with passage of time can be eliminated, thereby making it possible to provide the semiconductor memory device of high reliability.

It should be noted that the semiconductor memory device which comprises the reference voltage generating circuit has been described above. However, the reference voltage generating circuit having the burn-in circuit of this embodiment can be adapted to any other semiconductor devices.

II. Embodiment 2

Figure 2:
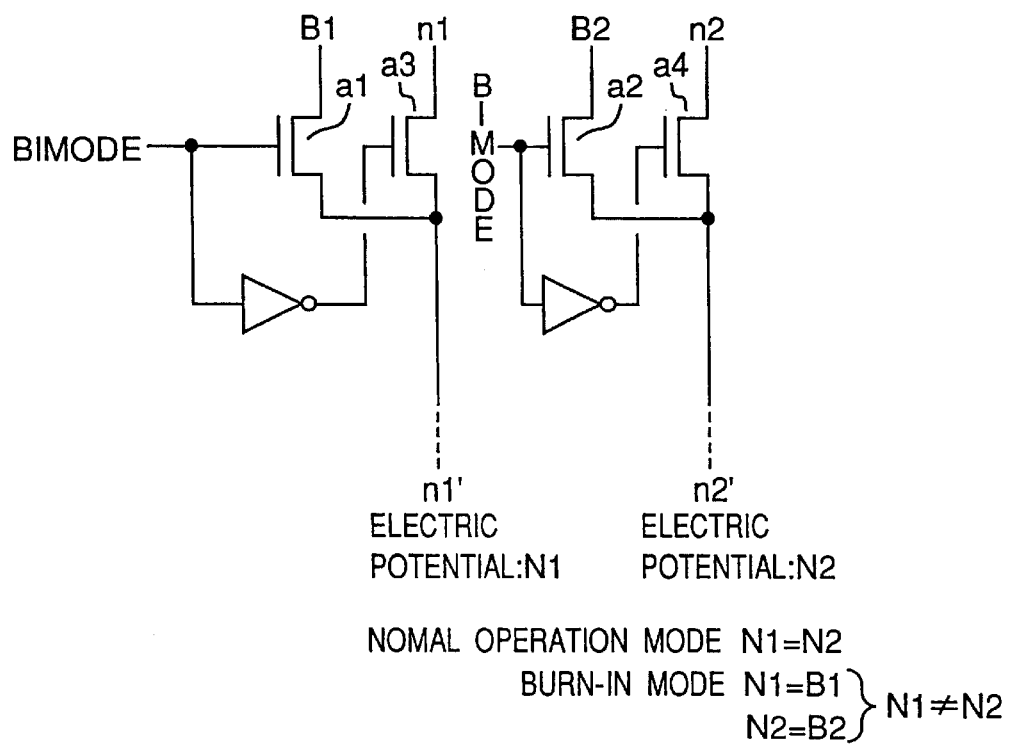
FIG. 2 shows a circuit diagram of a semiconductor memory device according to a second embodiment of the present invention.
Figure 3A:
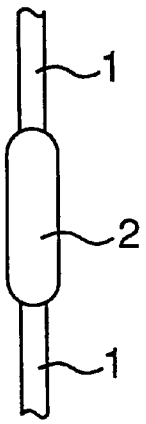
FIG. 3A is a schematic diagram showing a fuse on a circuit line.
Figure 3B:
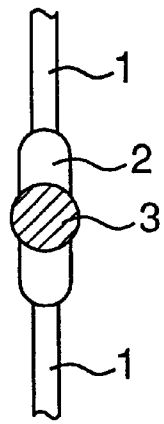
FIG. 3B is a view similar to FIG. 3A, showing the fuse being irradiated by a laser beam.

A circuit diagram of a semiconductor memory device according to the second embodiment of the present invention is shown in FIG. 2.

In the conventional semiconductor memory device, no voltage can be supplied between wires, for example, bit lines. Therefore, even though the bit line has a partially narrow portion, the semiconductor memory device having such a bit line can not be eliminated during the accelerating test, and therefore, the reliability of the conventional semiconductor memory device is not enough.

In the semiconductor memory device of this embodiment, as shown in FIG. 2, a transistor a1 is formed in the wire n1–n1', and a transistor a2 is formed in the wire n2–n2'.

Also, the source terminal of the transistor a1 is connected to the wire n1–n1', and voltage B1 is supplied to the drain terminal of the transistor a1. While the source terminal of the transistor a2 is connected to the wire n2–n2', and voltage B2 is supplied to the drain terminal of the transistor a2. The voltage B1 is not equal to the voltage B2.

In the normal operation mode, the transistors a1 and a2 are in an L level, while the transistors a3 and a4 are in an H level. In this case, no voltage is supplied between the wires n1–n1' and n2–n2'.

On the other hand, during the burn-in mode, a signal BIMODE is inputted to the gate terminals of the transistors a1 and a2, so that the transistors a1 and a2 turn into an H level, and the transistors a3 and a4 turn into an L level. Then, the voltage N1 of the wire n1–n1' becomes B1, and the voltage N2 of the wire n2–n2' becomes B2. This results in that a voltage equal to the difference between the voltages B1 and B2 is supplied between the wires n1–n1' and n2–n2', and the wires n1–n1' and n2–n2' are thus burned in. For example, voltages of 5 volts and 0 volt are supplied as B1 and B2, respectively.

It should be noted that, the signal BIMODE to the transistors a1 and a2 is preferably inputted through a single common input terminal.

As described above, because of the semiconductor memory device provided with the burn-in circuit, the semiconductor memory device having a wire whose characteristic changes with passage of time can be eliminated, thereby making it possible to provide the semiconductor memory device of high reliability.

What is claimed is:

1. A reference voltage generating circuit having specific terminals connected to terminals of at least one fuse for controlling resistance, said reference generating circuit comprising:
   a burn-in circuit connected to terminals of the at least one fuse, said burn-in circuit supplying a burn-in voltage between the terminals of the fuse when a control signal is inputted to the burn-in circuit, said burn-in circuit including at least
       a switching circuit electrically disconnecting said specific terminals from the terminals of the at least one fuse when the control signal is inputted; and
       a voltage supply circuit supplying a voltage between the terminals of the at least one fuse when the control signal is inputted.

2. A reference voltage generating circuit according to claim 1, wherein said switching circuit and said voltage supply circuit are controlled by the same control signal.

3. A semiconductor memory device comprising a reference voltage generating circuit according to claim 1.

4. A burn-in method for a semiconductor memory device having a plurality of wires, comprising:
   a burn-in step of electrically disconnecting wires from the semiconductor memory device, and supplying a voltage between the wires; and
   a selecting step of measuring a resistance of the wires in order to select the semiconductor memory device having a certain resistance after the burn-in step.

5. A burn-in method for a semiconductor memory device having a reference voltage generating circuit comprising the steps according to claim 4.

6. A semiconductor memory device holding plural wires at substantially the same electric potential in operation mode, comprising:
   plural first terminals selectively electrically connected to the plural wires and holding the plural wires at substantially the same electric potential when electrically connected to the plural wires;
   plural second terminals selectively electrically connected to the wires and supplying a burn-in voltage between the plural wires when electrically connected to the plural wires; and
   a switching circuit electrically selectively disconnecting said plural first terminals from the plural wires and electrically connecting said plural second terminals to the plural wires.

7. A semiconductor memory device according to claim 6, wherein said switching circuit is responsive to a control signal to electrically disconnect said plural first terminals from the plural wires, and said switching circuit is also responsive to the control signal to electrically connect said plural second terminals to the plural wires.

8. A burn-in circuit controlling the connection and voltage of at least one electrical element, said circuit comprising:
   a switching circuit electrically disconnecting a terminal of the at least one electrical element from a reference connection in response to a control signal; and
   a voltage supply circuit supplying a voltage to the disconnected terminal of the at least one electrical element in response to the control signal.

9. The burn-in circuit according to claim 8, wherein said switching circuit includes:
   a first transistor arrangement having a first terminal connected to a first terminal of the at least one electrical element, having a second terminal connected to said voltage supply circuit and being at a first voltage, and having a control input receiving the control signal;
   a second transistor arrangement having a first terminal connected to said first terminal of the at least one electrical element, having a second terminal connected to a first reference connection, and having a control input receiving a modification of the control signal,
   wherein said second transistor arrangement, responsive to receiving the modification of the control signal, changes conduction states and thus electrically disconnects said first terminal of the at least one electrical element from the first reference connection, and
   wherein said first transistor arrangement, responsive to receiving the control signal, changes conduction states and thus applies the first voltage to the first terminal of the at least one electrical element.

10. The burn-in circuit according to claim 9, wherein switching circuit includes an inverter providing the modified control circuit by inverting the logic state of the control signal.

11. The burn-in circuit according to claim 10, wherein the second transistor arrangement is field effect based.

12. The burn-in circuit according to claim 10, wherein the first transistor arrangement is field effect based.

13. The burn-in circuit according to claim 12, wherein the second transistor arrangement is field effect based.

14. The burn-in circuit of claim 9, wherein said switching circuit further includes:

a third transistor arrangement having a first terminal connected to a second terminal of the at least one electrical element, having a second terminal connected to said voltage supply circuit and being at a second voltage, and having a control input receiving the control signal;

a fourth transistor arrangement having a first terminal connected to said second terminal of the at least one electrical element, having a second terminal connected to a second reference connection, and having a control input receiving the modification of the control signal;

wherein said fourth transistor arrangement, responsive to receiving the modification of the control signal, changes conduction states and thus electrically disconnects said second terminal of the at least one electrical element from the second reference connection, and wherein said third transistor arrangement, responsive to receiving the control signal, changes conduction states and thus applies the second voltage to the second terminal of the at least one electrical element.

15. The burn-in circuit of claim 14, wherein said switching circuit further includes:

a fifth transistor arrangement having a first terminal connected to a first terminal of another electrical element, having a second terminal either connected to the first reference connection or connected to another reference connection, and having a control input receiving the modification of the control signal, wherein the first terminal of said first transistor arrangement is connected to the first terminal of the another electrical element, wherein said fifth transistor arrangement, responsive to receiving the modification of the control signal, changes conduction states and thus electrically disconnects said first terminal of the another electrical element from the reference connection connected to said second terminal of the fifth transistor arrangement, and wherein said first transistor arrangement, responsive to receiving the control signal, changes conduction states and thus applies the first voltage to the first terminal of the another electrical element.

16. The burn-in circuit of claim 15, wherein the first and second voltages are not equal.

17. The burn-in circuit of claim 16, wherein the electrical elements are fuses.

18. The burn-in circuit of claim 9, wherein said switching circuit further includes:

a third transistor arrangement having a first terminal connected to a first terminal of another electrical element, having a second terminal connected to said voltage supply circuit and being at a second voltage not equal to the first voltage, and having a control input receiving the control signal;

a fourth transistor arrangement having a first terminal connected to said first terminal of the another electrical element, having a second terminal connected to a second reference connection, and having a control input receiving the modification of the control signal, wherein said fourth transistor arrangement, responsive to receiving the modification of the control signal, changes conduction states and thus electrically disconnects said first terminal of the another electrical element from the second reference connection, and wherein said third transistor arrangement, responsive to receiving the control signal, changes conduction states and thus applies the second voltage to the first terminal of the another electrical element.

19. The burn-in circuit of claim 18, wherein the electrical elements are bit lines.

20. The burn-in circuit of claim 19, implemented in a semiconductor memory device.

* * * * *